United States Patent

[11] 3,567,963

[72] Inventor Gary A. Magee
Indianapolis, Ind.
[21] Appl. No. 826,968
[22] Filed May 22, 1969
[45] Patented Feb. 3, 1971
[73] Assignee The United States of America as represented by the Secretary of Navy

[54] FIELD EFFECT TRANSISTOR LOGIC GATE
5 Claims, 5 Drawing Figs.

[52] U.S. Cl. .......... 307/205, 307/208, 307/218
[51] Int. Cl. .......... H03k 19/08
[50] Field of Search .......... 307/205, 215, 216, 218, 251, 279

[56] References Cited

UNITED STATES PATENTS

| | | | |
|---|---|---|---|
| 2,995,666 | 8/1961 | Wood | 307/216X |
| 3,094,632 | 6/1963 | Wartella | 307/216 |
| 3,191,061 | 6/1965 | Weimer | 307/304 |
| 3,238,379 | 3/1966 | Clark | 307/216 |
| 3,356,858 | 12/1967 | Wanlass | 307/205 |

*Primary Examiner*—John S. Heyman
*Attorneys*—Edgar J. Brower and H. H. Losche

ABSTRACT: A field effect transistor logic gate having a pair of field effect transistors coupled through their source and drain terminals between information and timing input signals with the source terminal of each field effect transistor coupled to the gate terminal of the other field effect transistor and their drain terminals coupled in common as an output to gate through the information signal in time relation with the timing input signal on their respective source terminals, constituting an AND circuit which AND circuit is readily converted to a half-bit delay circuit by adding a field effect transistor serially in the output and gated by one of the input signals and which half-bits are readily paired and cascaded to 1-bit delay circuits and circulating memory logic circuits.

INVENTOR
GARY A. MAGEE

BY H. H. Losche

ATTORNEYS

FIELD EFFECT TRANSISTOR LOGIC GATE

STATEMENT OF GOVERNMENT INTEREST

The invention described herein may be manufactured and used by or for the Government of the United States of America for governmental purposes without the payment of any royalties thereof or therefor.

BACKGROUND OF THE INVENTION

This invention relates to logic gating circuits and more particularly to logic gates utilizing field effect transistors of the N or P type which field effect transistors are coupled to permit the information the information or intelligence signals and the timing signals to suffice as supply voltage for the circuit.

In prior known field effect transistor (FET) logic circuits the input intelligence signals, phased timing or clocking inputs, supply voltage source, and ground or fixed potential were all necessary to provide a workable device. For example, a voltage source, ground, and two clock pulses are needed for each bit delay circuit, and where these bit circuits are used in a cascaded array, there is a need for many crossovers. The disadvantages of these known FET logic circuits are that they are complicated by so many necessary inputs, they require many crossovers, the FETs must have different parameters to operate efficiently, and sometimes three and four clock pulse inputs are required.

SUMMARY OF THE INVENTION

In the present invention basically just two FETs are required to produce an AND logic circuit for two inputs. The two FETs are coupled with the drain terminals in common as an output. The source terminals of the two FETs are connectable to input signal sources and interconnected to the gate terminal of the other FET. The output can be coupled through a coupling FET to a source terminal of a succeeding similar half-bit circuit to produce a 1-bit circuit and such 1-bit circuits can be cascaded to produce a recirculating memory circuit with 1-bit delays for each stage. Only low signal powers are required for this circuit and no crossovers are needed in circuit arrays. It is accordingly a general object of this invention to provide a FET and logic gate circuit having only signal and clock timing voltages applied thereto for operating power and being capable of combining into 1bit logic circuits that can be cascaded to provide a recirculating memory circuit with bit delays.

BRIEF DESCRIPTION OF THE DRAWING

These and other objects and the attendance advantages, features, and uses will become more apparent to those skilled in the art as a more detailed description proceeds when considered along with the accompanying drawing, in which.

DESCRIPTION OF THE PREFERRED EMBODIMENT

Figure 1:
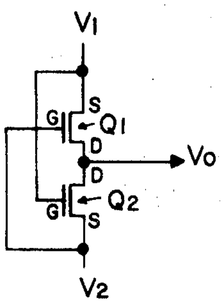
FIG. 1 illustrates a circuit schematic of a basic AND FET logic circuit in accordance with this invention.
Figure 2:
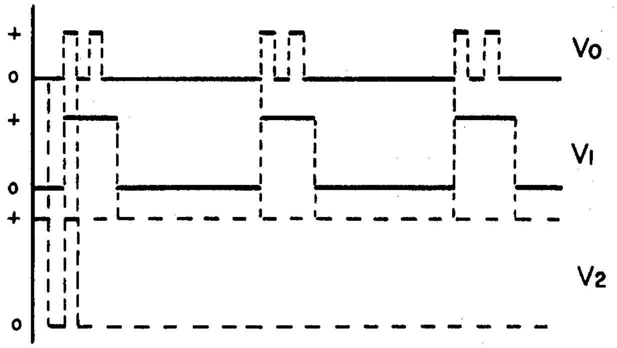
FIG. 2 is a graph of the input and output waveforms for the circuit of FIG. 1.

Referring more particularly to FIGS. 1 and 2, FIG. 1 shows a circuit schematic of the primary parts of a basic FET logic circuit in accordance with this invention. In FIG. 1 two FETs $Q_1$ and $Q_2$ are coupled with the drain terminals D coupled in common to an output $V_o$. The source terminals S of $Q_1$ is coupled directly to the gate terminal G of $Q_2$. In like manner the source terminal S of $Q_2$ is coupled directly to the gate terminal G of $Q_1$. The source terminal S of $Q_1$ is coupled to some signal source illustrated herein as being $V_1$, while the source terminal S of $Q_2$ is coupled to a signal source herein illustrated as being $V_2$. $Q_1$ and $Q_2$ may be either N type or P type FETs depending on whether positive voltage signals or negative voltage signals are applied to the circuit. For the waveforms shown in FIG. 2, $Q_1$ and $Q_2$ are N type FETs and it may be readily recognized that both positive signals must be present on inputs $V_1$ and $V_2$ to produce an output $V_o$, constituting AND circuit. Referring to FIG. 2, the $V_2$ signal is of higher frequency than the $V_1$ signal and, accordingly, when both $V_2$ and $V_1$ are in positive excursions a positive output voltage $V_o$ will be present. In the circuit of FIG. 1 only the $Q_1$ and $Q_2$ FETs are used with direct conductor couplings cross coupled between the source and the gate terminals to provide this AND gate.

Figure 3:
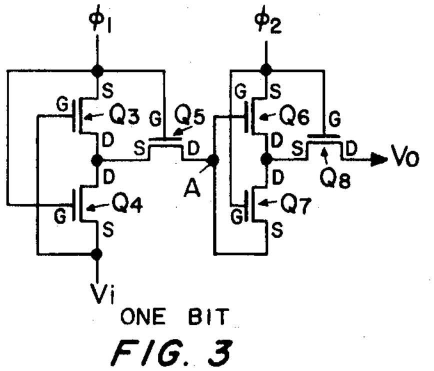
FIG. 3 is a circuit schematic of a 1-bit FET logic circuit made by FET coupling the basic AND circuit.
Figure 4:
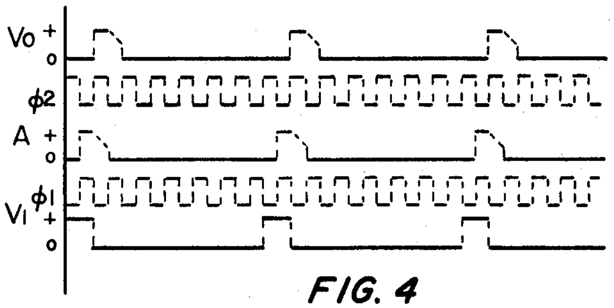
FIG. 4 is a graph of the input and output voltages and waveforms for the circuit in FIG. 3.

Referring more particularly to FIGS. 3 and 4, FIG. 3 illustrates a schematic wiring diagram of a 1-bit FET logic circuit in which the FETs Q3 and $Q_4$ as well as $Q_6$ and $Q_7$ are coupled in the same manner as shown in FIG. 1. Coupling FETs, such as $Q_5$ and $Q_8$, are shown in which the source terminals S of $Q_5$ is coupled to the output drain common coupling D of $Q_3$ and $Q_4$ and the gate terminal G of $Q_5$ is directly coupled to the source terminal S of $Q_3$. This provides a half-bit out of the basic AND circuit as shown in FIG. 1 in which the drain terminal D of $Q_5$ is coupled to the source and gate terminal coupling of $Q_7$ and $Q_6$, respectively, in the second half-bit. In like manner the source terminal S of $Q_8$ is coupled to the common drain D coupling of $Q_6$ and $Q_7$ and the output of the 1-bit is the drain terminal of $Q_8$ producing the $V_o$ output. The gate terminal G of $Q_8$ is directly coupled to the source terminal S of $Q_6$. In this 1-bit configuration the input signal $V_i$ is coupled to the source terminal of $Q_4$ and clock pulses are coupled as $\Phi_1$ and $\Phi_2$ to the source terminals of $Q_3$ and $Q_6$, respectively. Whenever an input signal $V_i$ is applied to the source terminal of $Q_4$ and a clock pulse $\Phi_1$ is applied to the source terminal of $Q_3$, the signal $V_i$ will pass through $Q_4$ and $Q_5$ to the output terminal A. This output terminal A provides the input to the second half-bit to place $Q_6$ in a conductive state when the clock pulse $\Phi_2$ is applied to pass the output signal at A through $Q_7$ and $Q_8$ to the drain terminal output D of $Q_8$ providing the output voltage $V_o$.

Referring more particularly to FIG. 4, the input signal voltage is shown in the bottom line $V_i$ and the $\Phi_1$ clock pulses shown in the line $\Phi_1$. Since the first half-bit operates as an AND circuit the output at terminal A will be produced as shown in line A of FIG. 4 with one-half bit delay. The clock pulses $\Phi_2$ are shown out of phase with clock pulses $\Phi_1$ herein and since there is some capacitance in the gate terminal of $Q_6$ the first output $V_o$ will occur 1-bit time from the beginning of the original $V_i$ input. Accordingly, at the second clock pulse $V_2$ and $V_i$ input will be produced on $V_o$ as shown in the top line of FIG. 4, each $V_i$ input being reproduced 1-bit delay.

Figure 5:
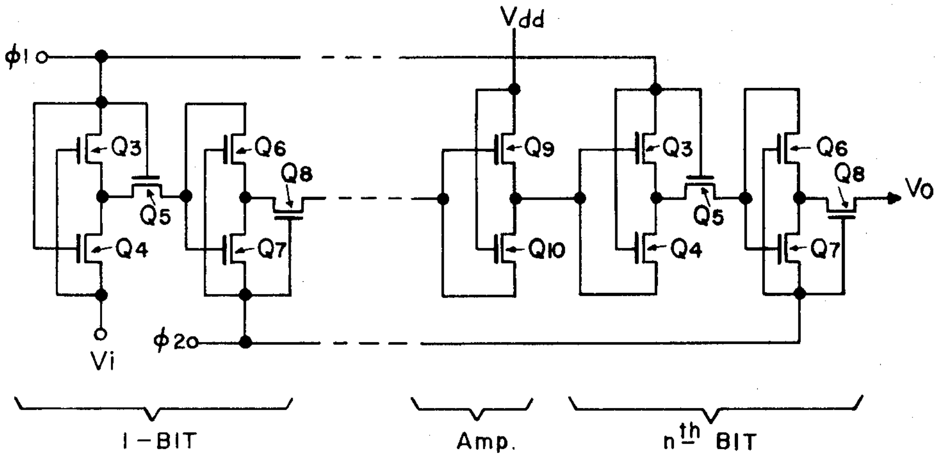
FIG. 5 is a circuit schematic of a cascade of 1-bit FET logic circuits made in accordance with this invention to provide a recirculating memory circuit.

Referring more particularly to FIG. 5 it is illustrated how the bits of FIG. 3 may be cascaded to provide a recirculating memory with a bit delay for each bit in the cascaded circuit. In the illustration of FIG. 5 the $\Phi_1$ clock pulses will be applied to alternate half-bits while the clock pulse $V_2$ will be applied to the other alternate half-bits of the cascaded circuit. It is pointed out that in this cascaded circuit no crossover connections need be used and no supply voltages or ground need be applied to the circuit. Wherever necessary in the cascaded circuit a FET amplifier may be utilized such as in the FET circuit of $Q_9$ and $Q_10$ and a supply voltage $V_{dd}$ applied to this amplifier only. In this manner a recirculating delay logic circuit may be constructed utilizing the basic logic circuit shown in FIG. 1 in which only the intelligence signal voltages and the clock pulse voltages are used for powering the cascaded circuit.

The operation of the circuit is believed to be understood from the above description and the graph diagrams in FIGS. 2 and 4 to utilize the circuits of FIG. 1 and AND circuits and half-bits in a logic circuit, and 1-bit logic of FIG. 3 may be used in whatever logic circuits are required. One example of the logic circuit is shown in FIG. 5 as a recirculating memory to produce 1-bit delays in input signal intelligence voltages for each bit of the recirculating circuit up to the $n$th bit.

While many modification may be made in the circuit shown and described in meet particular applications, I desire to be limited in the spirit of my invention only by the scope of the appended claims.

I claim:

1. A signal powered field effect transistor logic AND circuit comprising:
  a first field effect transistor having source, drain, and gate terminals; and
  a second field effect transistor having source, drain, and gate terminals with the drain terminals of said first and second field effect transistor coupled in common constituting an output and with the source material of each first and second field effect transistor cross coupled to the gate terminal of the other first and second field effect transistor, the source terminal of each first and second field effect transistor constituting a separate input whereby an AND logic circuit is provided for any two voltage signals applied to said two source terminals said voltage signals constituting the supply voltage for circuit operation.

2. A field effect transistor logic AND circuit as set forth in claim 1 wherein: said first and second field effect transistors are of the N type.

3. A field effect transistor logic AND circuit as set forth in claim 1 wherein: said first and second field effect transistors are of the P type.

4. A field effect transistor logic half-bit circuit comprising:
  a pair of N or P type signal powered field effect transistors each having source, drain, and gate terminals with the drain terminals coupled in common constituting an output and with the source terminals adapted to be coupled to signal inputs, the source terminal of each field effect transistor being coupled to the gate terminal of the other field effect transistor, constituting an AND logic circuit; and
  a third N or P type field effect transistor having source, drain, and gate terminals with the source and drain terminals in series in said output and said gate terminal coupled to the source terminal of one of said pair of field effect transistors thereby providing a ½bit delay circuit.

5. A field effect transistor logic comprising:
  a pair of N or P type signal powered field effect transistors each having source, drain, and gate terminals with the source terminals of each field effect transistor coupled to the gate terminal of the other field effect transistor, said source terminals constituting signal and first clock timing inputs and said drain terminals coupled in common constituting an output;
  a third N or P type field effect transistor having source, drain, and gate terminals with the source and drain terminals coupled in series in said output and the gate terminals coupled to the source terminal of one of said pair providing a first ½bit; and
  a second ½bit consisting of three N or P type field effect transistors constructed and arranged in a circuit identical to said first ½bit with the output of said first ½bit coupled to one source terminal of one of said field effect transistors in said second ½bit and having a second clock timing input coupled to said other source terminal of the other of said field effect transistors in said second ½bit providing a 1-bit delay logic circuit capable of cascading for a recirculating memory circuit whereby each 1-bit logic circuit provides a 1-bit delay memory.